United States Patent
Raghunathan et al.

(12) United States Patent (10) Patent No.: US 9,136,221 B2
Raghunathan et al. (45) Date of Patent: Sep. 15, 2015

(54) METHODS OF PROVIDING DIELECTRIC TO CONDUCTOR ADHESION IN PACKAGE STRUCTURES

(71) Applicant: INTEL CORPORATION, Santa Clara, CA (US)

(72) Inventors: Vinodhkumar Raghunathan, Chandler, AZ (US); Ebrahim Andideh, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/630,500

(22) Filed: Sep. 28, 2012

(65) Prior Publication Data

US 2014/0091469 A1    Apr. 3, 2014

(51) Int. Cl.
*H01L 23/532* (2006.01)
*H01L 23/538* (2006.01)
*H01L 21/02* (2006.01)
*H01L 23/498* (2006.01)
*H01L 21/48* (2006.01)

(52) U.S. Cl.
CPC ...... *H01L 23/5389* (2013.01); *H01L 21/02123* (2013.01); *H01L 21/02263* (2013.01); *H01L 21/4857* (2013.01); *H01L 23/49822* (2013.01); *H01L 23/53295* (2013.01); *H01L 2924/0002* (2013.01)

(58) Field of Classification Search
CPC ............ H01L 23/532; H01L 23/53204; H01L 21/02109; H01L 21/02225; H01L 21/0226
See application file for complete search history.

(56) References Cited

U.S. PATENT DOCUMENTS

| | | | |
|---|---|---|---|
| 2006/0049995 A1* | 3/2006 | Imaoka et al. | 343/702 |
| 2006/0292851 A1* | 12/2006 | Lin et al. | 438/618 |
| 2009/0206490 A1* | 8/2009 | Koide et al. | 257/774 |
| 2011/0001146 A1* | 1/2011 | Yamazaki et al. | 257/79 |
| 2012/0061827 A1* | 3/2012 | Fujita | 257/737 |

* cited by examiner

*Primary Examiner* — Cheung Lee
(74) *Attorney, Agent, or Firm* — Blakely, Sokoloff, Taylor & Zafman LLP

(57) ABSTRACT

Methods of forming a microelectronic packaging structure and associated structures formed thereby are described. Those methods may include forming a CVD dielectric material on a package dielectric material, and then forming a conductive material on the CVD dielectric material.

21 Claims, 10 Drawing Sheets

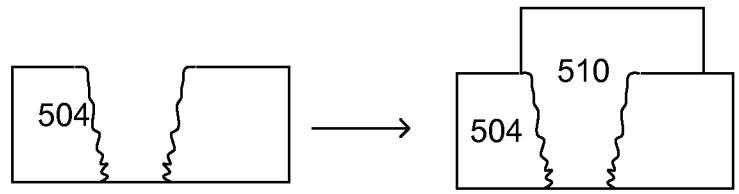
FIG. 5a
Prior Art
FIG. 5b
Prior Art
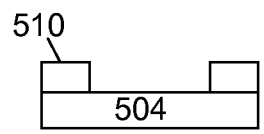
FIG. 5c
(Prior Art)
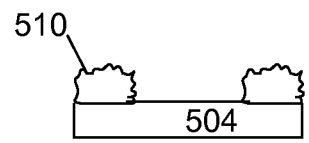
FIG. 5d
(Prior Art)
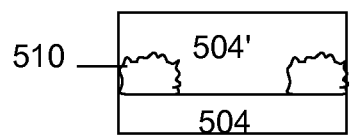
FIG. 5e
(Prior Art)

METHODS OF PROVIDING DIELECTRIC TO CONDUCTOR ADHESION IN PACKAGE STRUCTURES

BACK GROUND OF THE INVENTION

As microelectronic packaging technology advances for higher processor performance, advances in packaging structures may include improving adhesion between conductive materials and dielectric materials that may be stacked upon/built up on each other during packaging formation. In some instances, adhesion between these two materials may be enhanced by roughening the dielectric or the conductive material. For example, in FIGS. 5a-5b (Prior Art) a dielectric material 504 is roughened prior to metal 510 formation. In FIGS. 5c-5e (Prior Art), a conductive material 510 disposed on a dielectric material 504 is roughened prior to a dielectric 504' lamination process. The roughness created during these processes (which may require messy wet chemicals, etc.) often results in line level high frequency impedance losses for packaging structures employing such surface roughening techniques. Additionally, the roughness may be on the order of one micron or greater in some cases, thus impacting performance.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

FIGS. 5a-5e represent structures from the Prior Art.

DETAILED DESCRIPTION OF THE PRESENT INVENTION

Figure 1A:
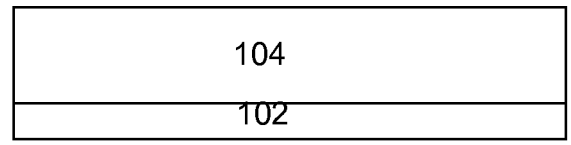
FIGS. 1a-1h represent structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as package structures, are described. Those methods may include forming a chemical vapor deposition (CVD) dielectric material on a package dielectric material, and then forming a conductive material on the CVD dielectric material. The various embodiments included herein promote and improve the adhesion between conductive material and dielectric buildup material of various types of package structures.

Figure 1B:
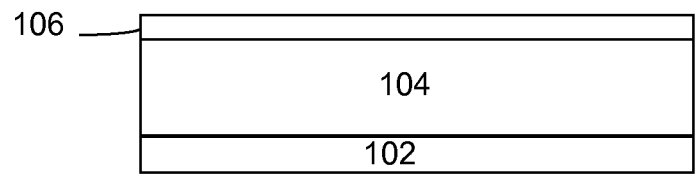

FIGS. 1a-1h illustrate embodiments of methods of forming microelectronic structures, such as a package structure, for example. In an embodiment, a first dielectric material 104, which may comprise a first package dielectric material 104, may be disposed on a substrate 102 (FIG. 1a). In an embodiment, the substrate 102 may comprise any material upon which dielectric layers and conductive layers may be formed upon to fabricate a package structure. The first dielectric material 104 may comprise such materials as ABF, prepeg, etc, but may comprise other materials depending upon the particular application. A first CVD dielectric material 106, may be formed on the first dielectric material 104 (FIG. 1b).

The first CVD dielectric material 106 may comprise at least one of a silicon nitride, a silicon carbide (non conductive), carbon doped silicon nitride, nitrogen doped silicon carbide, carbon doped silicon oxynitride, a silicon oxide, a carbon doped oxide, and a silicon oxynitride in an embodiment. In other embodiments the first CVD dielectric material 106 may comprise any suitable CVD dielectric material, according to the particular application. In an embodiment, the CVD dielectric material may comprise a plasma enhanced CVD (PECVD) dielectric material. In an embodiment, the first CVD dielectric material 106 may comprise a thickness between about 100 angstroms to about 1000 angstroms. In an embodiment, the dielectric material 104 may be substantially smooth and may not comprise surface roughness.

Figure 1C:
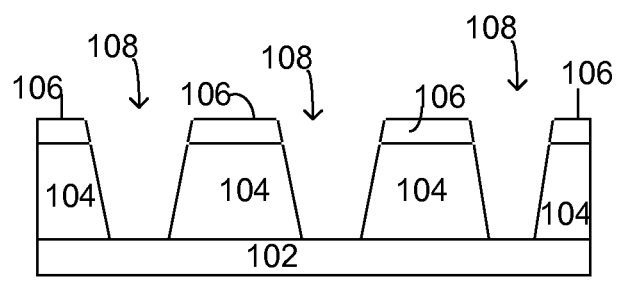
Figure 1D:
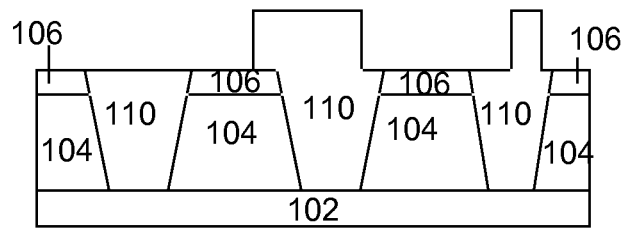

In an embodiment, openings 108 may be created in the first CVD dielectric material 106 and the first dielectric material 104. The openings 108 may comprise vias 108, and may be formed using such techniques as laser drilling and lithographic patterning, in some cases (FIG. 1c). The openings 108 through the first CVD dielectric material 106 and the first dielectric material 104 may be formed in one process step in some cases, or may be formed in two separate removal steps for each of the individual CVD dielectric material 106 and dielectric material 104, in other embodiments. Conductive material 110, such as but not limited to copper, may be formed within the openings 108, and in some cases may be formed on the first CVD dielectric material 106 (FIG. 1d). The conductive material 110 may be formed using such process techniques as seed layer formation followed by a plate up process, and/or a semi-additive process (SAP).

The first CVD dielectric material provides adhesion between the first dielectric material 104 and the conductive material 110 without the need for roughening of the conductive material, and may be located directly adjacent the first dielectric material 104. In some cases, the first CVD dielectric material 112 forms covalent bonds with the conductive material 110. In an embodiment, the conductive material 110 comprises little to no roughness, and generally will not exceed more than about 0.1 to about 0.5 microns in roughness. In an embodiment, the conductive material 110 may be substantially smooth around an outer region at an interface between the conductive material 110 and the first dielectric material 104.

Figure 1E:
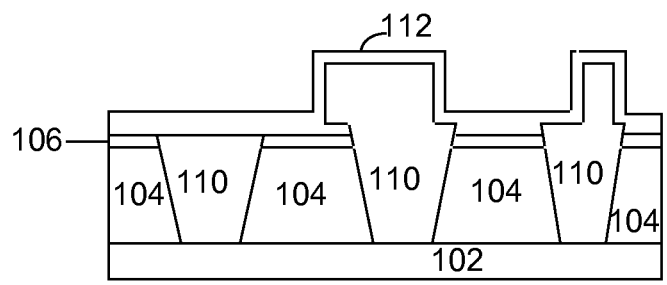

A second CVD dielectric material 112 may be formed on the conductive material 110 (FIG. 1e). The second CVD material 112 may comprise at least one of a silicon nitride, a silicon carbide (non conductive), carbon doped silicon nitride, nitrogen doped silicon carbide, carbon doped silicon oxynitride, a silicon oxide, a carbon doped oxide, and a silicon oxynitride, in an embodiment. In other embodiments, the second CVD dielectric material 112 may comprise any suitable CVD dielectric material, according to the particular application. In an embodiment, the second CVD dielectric material 112 may comprise a thickness between about 100 angstroms to about 1000 angstroms.

Figure 1F:
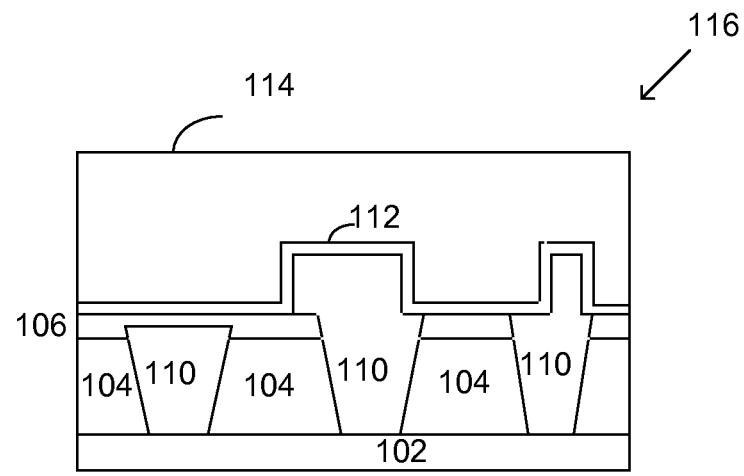
Figure 1G:
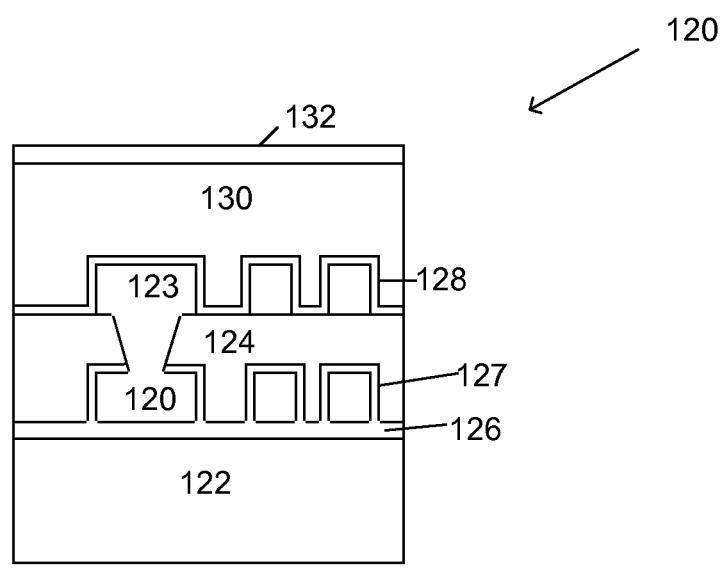

A second dielectric material 114 may be formed on the second CVD dielectric material 112, to form a portion of a package structure 116 (FIG. 1f). In an embodiment, the second dielectric material 114 may be laminated onto the second CVD dielectric material 112. The second CVD dielectric material 112 provides for the adhesion between the conductive material 110 and the second dielectric material 114. In some cases, the second CVD dielectric material 112 forms covalent bonds with the conductive material 110.

In another embodiment (FIG. 1g), a portion of a package structure 120 may comprise first, second and third dielectric materials 122, 124, 130, and first, second, third and fourth CVD dielectric materials 126, 127, 128, 132. A first level of conductive material 120 (that is disposed on the first dielectric material 122) is disposed on a top surface of the first CVD dielectric material 126, and the second CVD dielectric material 127 is disposed on a top surface of the first level of conductive material 120. The third CVD dielectric material 128 is disposed on a top surface of the second level of conductive material 123 (that is disposed on the second dielectric material 124), and the fourth level of CVD dielectric material is disposed on the third dielectric material 130.

Figure 1H:
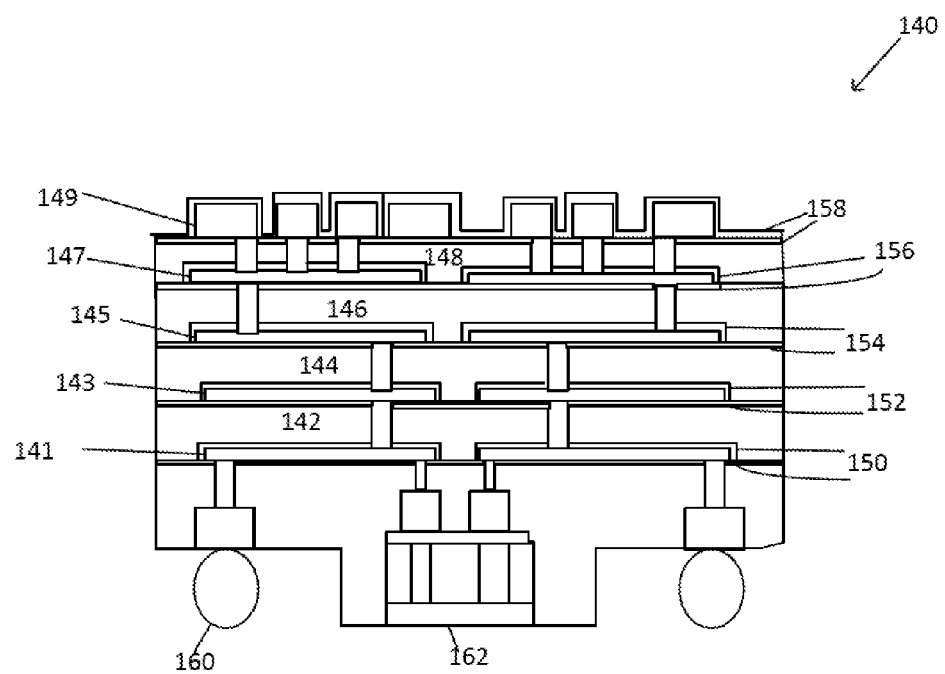

FIG. 1h depicts a portion of a package structure 140 comprising the use of the CVD dielectric material as a glue layer/adhesion layer between the conductive layers/material and the dielectric layers/material of the package structure 140. Conductive layers/material (which may comprise copper in some cases) 143, 145, 147 may be disposed on dielectric layers/material 142, 144, 146 respectively. CVD dielectric materials 150, 152, 154, and 156 are disposed on conductive layers/material 141, 143, 145, and 147 respectively, and may be optionally diisposed directly underneath the conductive layers/materials 141, 143, 145, 147 respectively.

The CVD dielectric material 158 may be disposed on signal pads 149. A die 162 may be disposed within the package structure 140, wherein the package structure 140 may comprise a Bumpless Build Up Layer (BBUL) package structure 140. In other embodiments, the die may be disposed in other locations, such as on a top surface of package build up layers, for example, and may comprise any other type of package structure according to the particular application. In general, the CVD dielectric layers of the embodiments herein may be utilized to provide enhanced, reliable adhesion between any conductive materials and dielectric materials in a package structure, such as in build up layers of such package structures.

Figure 2A:
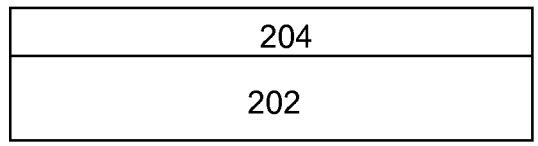
FIGS. 2a-2h represent structures according to embodiments.
Figure 2B:
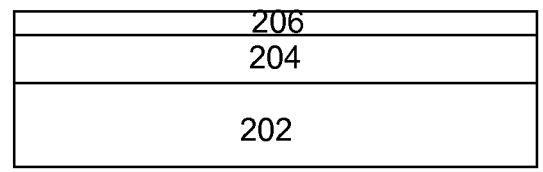

FIGS. 2a-2h illustrate embodiments of further methods of forming microelectronic structures, such as package structures. In an embodiment, a first dielectric material 204 may be disposed on a substrate 202 (FIG. 2a). The first dielectric material 204 may comprise such materials as ABF, prepeg, etc, but may comprise other materials depending upon the particular application. A first CVD dielectric material 206, may be formed on the first dielectric material 204 (FIG. 2b).

The first CVD dielectric material 206 may comprise at least one of a silicon nitride, a silicon carbide carbide (non conductive), carbon doped silicon nitride, nitrogen doped silicon carbide, carbon doped silicon oxynitride, a silicon oxide, a carbon doped oxide, and a silicon oxynitride in an embodiment. In other embodiments the first CVD dielectric material 106 may comprise any suitable CVD dielectric material, including any PECVD dielectric materials, according to the particular application. In an embodiment, the first CVD dielectric material 206 may comprise a thickness between about 100 angstroms to about 1000 angstroms.

Figure 2C:
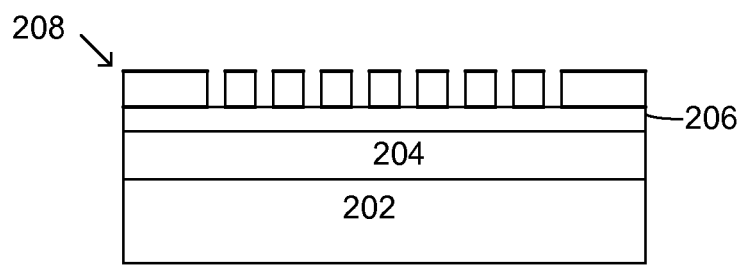
Figure 2D:
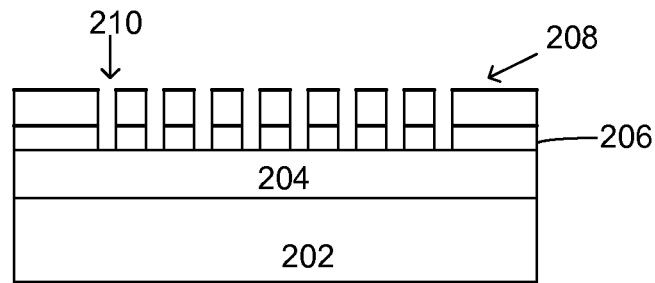
Figure 2E:
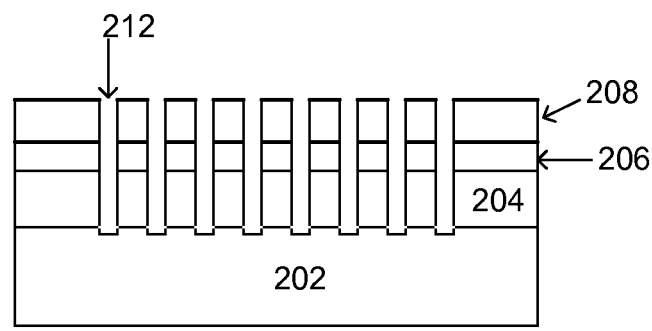

In an embodiment, a resist material 208 may be formed and patterned on the first CVD dielectric material 206 (FIG. 2c). The resist material 208 may comprise a dry film resist (DFR) material in some cases. In an embodiment, openings 210 may be created in the first CVD dielectric material 206 (FIG. 2d). The openings 210 may comprise vias 210, and may be formed using such techniques as plasma etching (FIG. 2d). In an embodiment, openings 212 may be subsequently formed/etched in the dielectric material 204 (FIG. 2e). The openings 212 may comprise vias 212, and may be formed using such techniques as plasma etching, wherein the first CVD dielectric material 206 serves as a hard mask for the dielectric material 204 plasma etching/removal process.

Figure 2F:
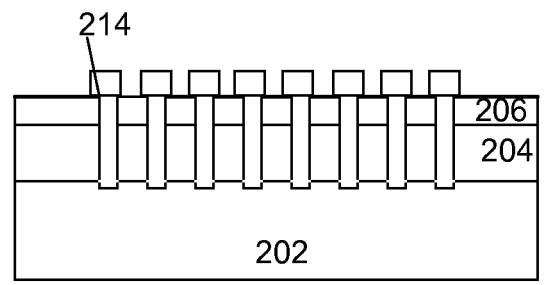

Conductive material 214, such as but not limited to copper, may be formed within the openings 212, and in some cases may be formed on a surface of first CVD dielectric material 206 (FIG. 2f). The conductive material 214 may be formed using such process techniques as seed layer formation followed by a plate up process, and/or a semi-additive process (SAP).

The first CVD dielectric material 206 provides adhesion between the dielectric material 204 and the conductive material 214. In some cases, the first CVD dielectric material 206 forms covalent bonds with the conductive material 214. In an embodiment, the conductive material 214 comprises little to no roughness, and generally will not exceed more than about 0.1 to about 0.5 micron in roughness.

Figure 2G:
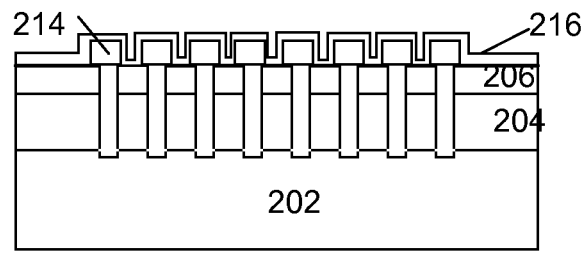

A second CVD dielectric material 216 may be formed on the conductive material 214 (FIG. 2g). The second CVD dielectric material 216 may comprise at least one of a silicon nitride, a silicon carbide carbide (non conductive), carbon doped silicon nitride, nitrogen doped silicon carbide, carbon doped silicon oxynitride, a silicon oxide, a carbon doped oxide and a silicon oxynitride, in an embodiment. In other embodiments, the second CVD dielectric material 216 may comprise any suitable CVD dielectric material, according to the particular application. In an embodiment, the second CVD dielectric material 216 may comprise a thickness between about 100 angstroms to about 1000 angstroms.

Figure 2H:
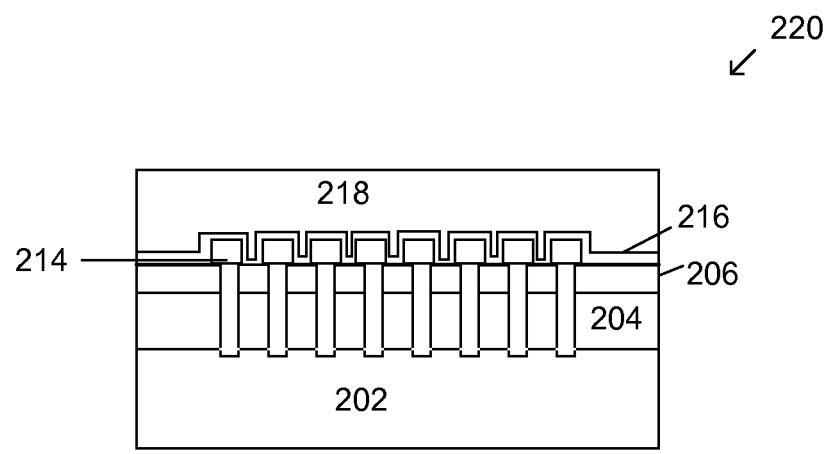

A second dielectric material 218 may be formed on the second CVD dielectric material 216, to form a portion of a package structure 220 (FIG. 2h). In an embodiment, the second dielectric material 218 may be laminated onto the second CVD dielectric material 216. The second CVD dielectric material 216 provides adhesion between the conductive material 214 and the second dielectric material 218. In some cases, the second CVD dielectric material 216 forms covalent bonds with the conductive material 214 thereby improving adhesion.

The package structures and portions thereof described herein (for example, but not limited to, the package structures of FIGS. 1g, 1h and 2h, for example) may comprise any suitable type of package structures capable of providing electrical communications between a microelectronic device, such as a die and a next-level component to which the package structures may be coupled (e.g., a circuit board). In another embodiment, the package structures herein may comprise any suitable type of package structures capable of providing electrical communication between a die and an upper IC package coupled with a lower IC package.

The package structures of the embodiments herein may also provide structural support for a die. By way of example, in one embodiment, the package structures may comprise a multi-layer substrate—including alternating layers of a dielectric material and metal—built-up around a core layer (either a dielectric or metal core). In another embodiment, the package substrates may comprises a coreless multi-layer substrate. Other types of substrates and substrate materials may also find use with the disclosed embodiments (e.g., ceramics, sapphire, glass, etc.). Further, according to one embodiment, the package substrate may comprise alternating layers of dielectric material and metal that are built-up over the die 120 itself, this process sometimes referred to as a "Bumpless Build-up Process (BBUL)."

A die (such as die 162 of FIG. 1*h*), which may comprise a silicon logic die or a memory die, for example, or any type of suitable microelectronic device/die, may be disposed on a back side or on a front side of the package structures herein. In some embodiments the package structures may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

The various embodiments included herein promote and improve the adhesion between conductive material/layers, such as copper metal layers, and dielectric buildup material/layers of various types of package structures. The various embodiments herein alleviate the need to roughen the metal lines during build up processes, since the CVD dielectric material provides/enhances adhesion between the two materials, which significantly reduces impedance related line high frequency losses. In some embodiments, the CVD dielectric material provides a cap/barrier layer for the conductive metal lines against electromigration, as the line/space dimension scaling becomes smaller and smaller. The embodiments provide an alternate methodology for adhesion improvement by alleviating the need to use harsh wet chemistries that are frequently used for adhesion improvement, thus enhancing overall package performance and reliability. Additionally, the CVD dielectric material may be used as a patterning hard mask to implement a damascene bulk via patterning process flow, in some cases.

Figure 3:
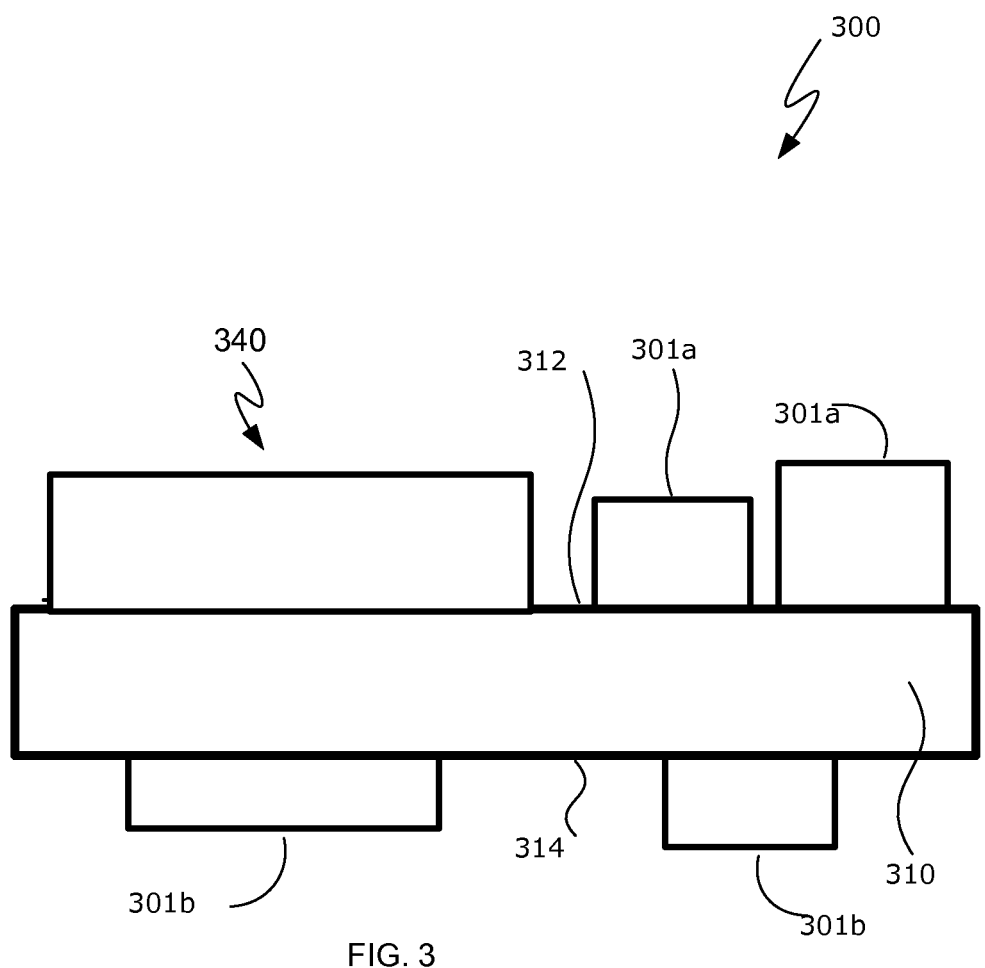
FIG. 3 represent a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure disposed on the mainboard's first side 612, wherein the package structure may comprise any of the adhesion enhanced package structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301*a* may be disposed on the first side 312 of the mainboard 310, and components 301*b* may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
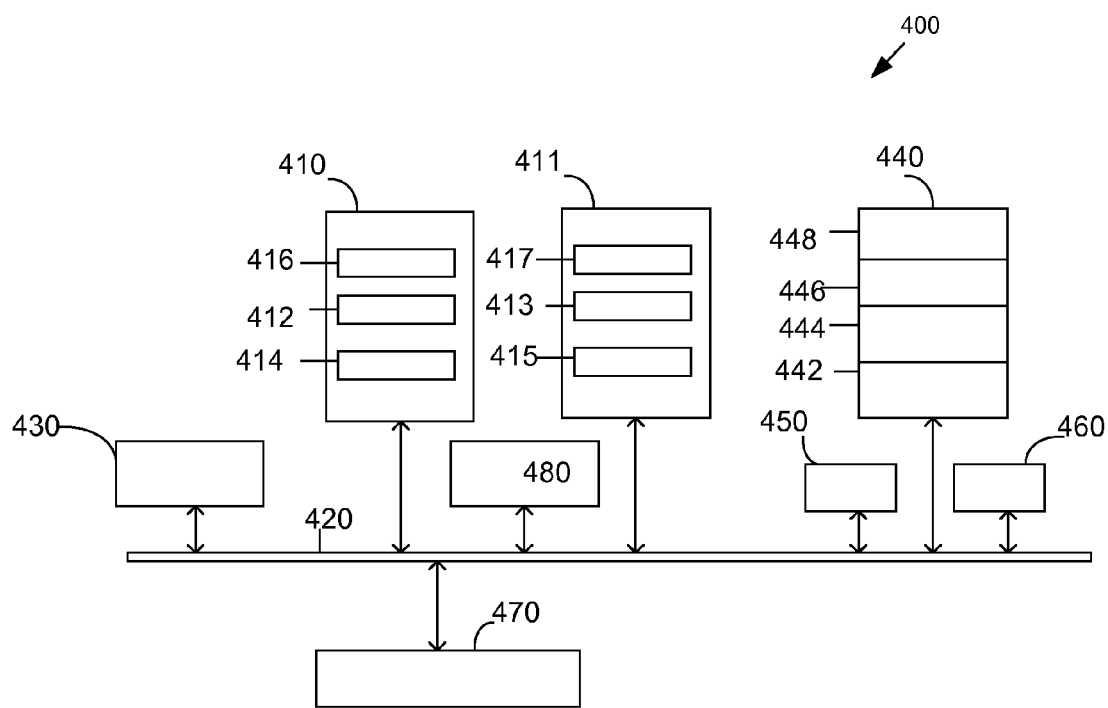
FIG. 4 represents a system according to embodiments.

FIG. 4 is a schematic of a computer system 400 according to an embodiment. The computer system 400 (also referred to as the electronic system 400) as depicted can embody/include a package structure/device that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of an exemplary microelectronic device that pertains to the practice of the embodiments. Thus the embodiments are not limited to the structures described herein.

What is claimed is:

1. A package structure comprising:
a first CVD dielectric glue material disposed on a first dielectric build up material of a package structure wherein the first CVD dielectric glue material is a different material than the first dielectric build up material;
a first opening formed through the first CVD dielectric glue material and through the first dielectric build up material;
and a conductive material disposed on the first CVD dielectric glue material and into the first opening, wherein the conductive material contacts a sidewall surface of the first CVD dielectric glue material and a sidewall surface of the first dielectric build up material in the first opening, and wherein the conductive material does not make physical contact with a top surface of the first dielectric build up material.

2. The structure of claim 1 further comprising a second CVD dielectric glue material on the conductive material.

3. The structure of claim 2 further comprising a second dielectric build up material of the package substrate on the second CVD dielectric glue material.

4. The structure of claim 2 further comprising wherein at least one of the first and the second CVD dielectric glue material comprise a thickness of about 100 angstroms to about 1000 angstroms.

5. The structure of claim 2 wherein the first and the second CVD dielectric glue material comprise at least one of a silicon nitride, a non-conductive silicon carbide, a carbon doped silicon nitride, a nitrogen doped silicon carbide, a carbon doped silicon oxynitride, a carbon doped oxide and a silicon oxynitride.

6. The structure of claim 1 further comprising wherein at least one of the first and the second dielectric build up material comprises a package build up layer.

7. The structure of claim 1 further comprising wherein the conductive material comprises copper.

8. The structure of claim 7 further comprising wherein the copper is substantially smooth around an outer region at an interface between the copper and the first dielectric buildup material.

9. The structure of claim 1 further comprising wherein the package structure comprises a portion of a coreless BBUL package.

10. The structure of claim 1 wherein the package structure further comprises a die.

11. The structure of claim 1 wherein at least one of the first and the second CVD dielectric glue materials comprise a PECVD dielectric material.

12. A structure comprising:
a first CVD dielectric glue material disposed on a package build up dielectric material of a package structure wherein the first CVD dielectric glue material is different than the package build up dielectric material;
a first opening formed through the first CVD dielectric glue material and through the package build up dielectric material;
a conductive material disposed into the first opening, wherein the conductive material contacts a sidewall surface of the first CVD dielectric glue material and a sidewall surface of the package build up dielectric material in the first opening;
a second CVD dielectric glue material disposed on the conductive material, wherein the conductive material does not make physical contact with a top surface of the build up dielectric material; and
a die coupled to the package structure.

13. The structure of claim 12 wherein the first and the second CVD dielectric glue material comprise a thickness of about 100 angstroms to about 1000 angstroms.

14. The structure of claim 12 wherein the first and the second CVD dielectric glue material comprises at least one of a silicon nitride, a non conductive silicon carbide, a carbon doped silicon nitride, a nitrogen doped silicon carbide, a carbon doped silicon oxynitride, a carbon doped oxide and a silicon oxynitride.

15. The structure of claim 12 further comprising wherein the conductive material comprises a roughness of less than about 0.1 to about 0.5 micron.

16. The structure of claim 12 further comprising wherein the conductive material comprises copper.

17. The structure of claim 12 further comprising wherein at least one of the first and the second CVD dielectric glue material forms a barrier layer for electromigration.

18. The structure of claim 12 further comprising wherein the package structure comprises a portion of a coreless BBUL package structure.

19. The structure of claim 18 wherein a die is coupled to the careless BBUL package structure, and wherein the die is one of partially and fully embedded in the coreless BBUL package structure.

20. The structure of claim 12 further comprising a system comprising: a bus communicatively coupled to the structure; and an eDRAM communicatively coupled to the bus.

21. The structure of claim 12 wherein at least one of the first and the second CVD dielectric glue materials comprise a PECVD dielectric material.

* * * * *